United States Patent
Mikami et al.

(10) Patent No.: US 9,905,534 B2
(45) Date of Patent: Feb. 27, 2018

(54) MULTI-CHIP SEMICONDUCTOR DEVICE

(71) Applicant: OLYMPUS CORPORATION, Tokyo (JP)

(72) Inventors: Masato Mikami, Hachioji (JP); Takanori Sekido, Machida (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/007,402

(22) Filed: Jan. 27, 2016

(65) Prior Publication Data

US 2016/0141269 A1    May 19, 2016

Related U.S. Application Data

(62) Division of application No. 14/031,218, filed on Sep. 19, 2013, now Pat. No. 9,281,294.

(30) Foreign Application Priority Data

Sep. 21, 2012   (JP) .................................. 2012-208586

(51) Int. Cl.
*H01L 23/48* (2006.01)
*H01L 29/40* (2006.01)
(Continued)

(52) U.S. Cl.
CPC ........ *H01L 25/065* (2013.01); *H01L 23/3178* (2013.01); *H01L 25/00* (2013.01);
(Continued)

(58) Field of Classification Search
CPC ............... H01L 25/065; H01L 23/3178; H01L 2924/0002; H01L 2224/11; H01L 25/00;
(Continued)

(56) References Cited

U.S. PATENT DOCUMENTS 4,426,689 A * 1/1984 Henle ..................... H01L 23/14
                                                      257/E21.511
5,956,235 A    9/1999 Kresge et al.
(Continued)

FOREIGN PATENT DOCUMENTS

JP    H11-168172 A    6/1999
JP    2001-035991 A    2/2001
(Continued)

OTHER PUBLICATIONS

Japanese Office Action dated Jun. 28, 2016 in related Japanese Patent Application No. 2012-208586.
(Continued)

*Primary Examiner* — Shouxiang Hu
(74) *Attorney, Agent, or Firm* — Scully, Scott, Murphy & Presser, P.C.

(57) ABSTRACT

A multi-chip semiconductor device includes a plate-shaped first semiconductor chip having a first connection portion in which a first semiconductor chip electrode is formed on a first main surface of the first semiconductor chip or on a first side surface vertical to the first main surface, and a plate-shaped second semiconductor chip having a second connection portion in which a second semiconductor chip electrode is formed on a second side surface vertical to a second main surface of the second semiconductor chip. Each of the first and second connection portions includes at least an inclined surface that is inclined with respect to each of the first and second main surfaces. The first connection portion and the second connection portion are connected to each other such that the first main surface of the first semiconductor chip and the second main surface of the second semiconductor chip are vertical to each other.

5 Claims, 4 Drawing Sheets

(51) Int. Cl.
*H01L 25/065* (2006.01)
*H01L 25/00* (2006.01)
*H01L 23/31* (2006.01)

(52) U.S. Cl.
CPC ...... *H01L 25/0655* (2013.01); *H01L 25/0657* (2013.01); *H01L 2224/11* (2013.01); *H01L 2924/0002* (2013.01)

(58) Field of Classification Search
CPC . H01L 25/0657; H01L 25/0655; H01L 24/16; H01L 24/81; H01L 23/13; H01L 2924/15153; H01L 2224/0401; H01L 2224/16147; H01L 2224/83141; H01L 2225/06551; H01L 2224/48465
USPC ....... 257/777, 676, 678, 686, 723, 724, 730, 257/622
See application file for complete search history.

(56) References Cited

U.S. PATENT DOCUMENTS

| | | |
|---|---|---|
| 6,114,221 A | 9/2000 | Tonti et al. |
| 7,964,964 B2 | 6/2011 | Sheats |
| 8,265,436 B2 | 9/2012 | Shih et al. |
| 8,363,988 B2 | 1/2013 | Kim et al. |
| 2009/0321929 A1 | 12/2009 | Feng et al. |
| 2013/0075915 A1* | 3/2013 | Kim ...................... H01L 25/065 257/773 |

FOREIGN PATENT DOCUMENTS

| | | |
|---|---|---|
| JP | 2001-217373 A | 8/2001 |
| JP | 2001-291822 A | 10/2001 |
| JP | 2002-076244 A | 3/2002 |

OTHER PUBLICATIONS

U.S. Office Action dated May 21, 2015 received in U.S. Appl. No. 14/031,218.

Japanese Office Action dated Aug. 29, 2017 in Japanese Patent Application No. 2016-233132.

* cited by examiner

MULTI-CHIP SEMICONDUCTOR DEVICE

CROSS-REFERENCE TO RELATED APPLICATIONS

This application is a Divisional Application of U.S. patent application Ser. No. 14/031,218 filed Sep. 19, 2013 which is based upon and claims the benefit of priority from Japanese Patent Application No. 2012-208586, filed on Sep. 21, 2012, the entire contents of each of which are incorporated herein by reference.

BACKGROUND

1. Technical Field

The disclosure relates to a multi-chip semiconductor device which is configured to connect semiconductor chips having individual functions to each other.

2. Related Art

In related art, a multi-chip semiconductor device having a plurality of functions is manufactured by connecting semiconductor chips having individual functions to each other.

Techniques for manufacturing such a multi-chip semiconductor device are known. In one technique, a groove is formed on an electrode forming surface of one semiconductor chip constituting the multi-chip semiconductor device and another semiconductor chip is inserted into the groove. With this structure, the two semiconductor chips are connected so as to be vertical to each other with good alignment accuracy, and heat dissipation efficiency of the multi-chip semiconductor device can be improved (see Japanese Patent Application Laid-open No. 2002-76244, for example).

SUMMARY

In some embodiments, a multi-chip semiconductor device, includes a first semiconductor chip that is plate-shaped and includes a first connection portion in which a first semiconductor chip electrode is formed on a first main surface of the first semiconductor chip or on a first side surface vertical to the first main surface, and a second semiconductor chip that is plate-shaped and includes a second connection portion in which a second semiconductor chip electrode is formed on a second side surface vertical to a second main surface of the second semiconductor chip. Each of the first connection portion and the second connection portion includes at least an inclined surface that is inclined with respect to each of the first and second main surfaces. The first connection portion and the second connection portion are connected to each other such that the first main surface of the first semiconductor chip and the second main surface of the second semiconductor chip are vertical to each other.

The above and other features, advantages and technical and industrial significance of this invention will be better understood by reading the following detailed description of presently preferred embodiments of the invention, when considered in connection with the accompanying drawings.

DETAILED DESCRIPTION

Exemplary embodiments will be described below with reference to accompanying drawings. The invention is not limited to these embodiments. In addition, the same components are denoted by the same symbols in the description of the drawings. It is noted that the drawings are merely schematic and a relation between a thickness and a width of each member and a ratio of each member are different from actual ones. Even drawings seem to be mutually related, the components having different dimensional relation and ratio may be included.

First Embodiment

Figure 1:
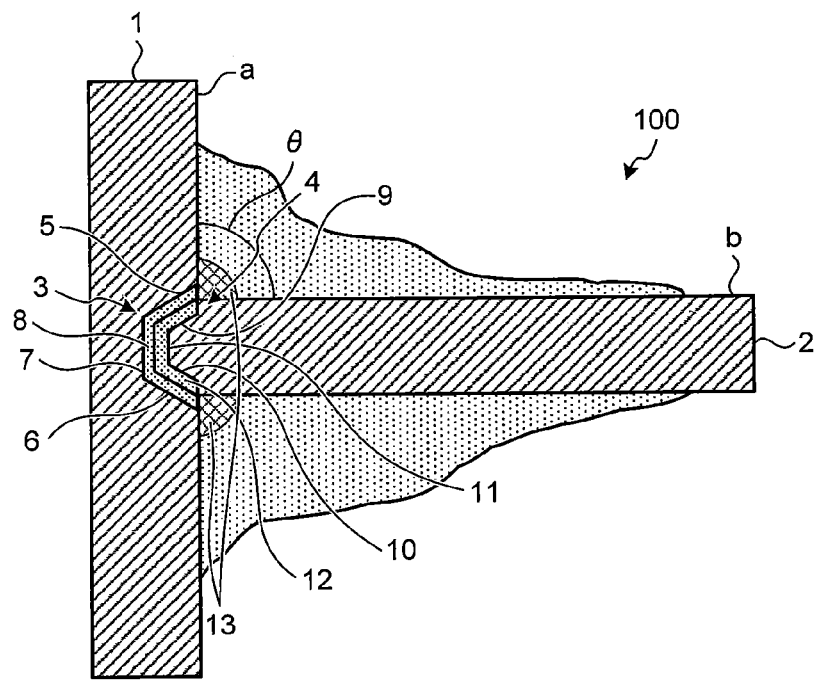
FIG. 1 is a cross-sectional view of a multi-chip semiconductor device according to a first embodiment of the invention.

FIG. 1 is a cross-sectional view of a multi-chip semiconductor device 100 according to a first embodiment of the invention. In the multi-chip semiconductor device 100, a second connection portion 4, which is formed on a side surface of a second semiconductor chip 2, is fitted into and connected to a groove-shaped first connection portion 3 formed on a first semiconductor chip 1.

The first semiconductor chip 1 is plate-shaped and includes the groove-shaped first connection portion 3 formed on a main surface "a" of the first semiconductor chip 1. The first connection portion 3 includes a first inclined surface 5 and a second inclined surface 6 which are inclined with respect to the main surface "a" of the first semiconductor chip 1, and a bottom surface 7 parallel to the main surface "a" of the first semiconductor chip 1. In addition, a plurality of first semiconductor chip electrodes 8 are formed on the first connection portion 3 at a specified interval such that the first semiconductor chip electrodes 8 are insulated by an insulation member.

The second semiconductor chip 2 is plate-shaped and includes the second connection portion 4 which is formed on a side surface vertical to a main surface "b" of the second semiconductor chip 2. The second connection portion 4 includes a third inclined surface 9 and a fourth inclined surface 10 which are inclined with respect to the main surface "b" of the second semiconductor chip 2, and a bottom surface 11 vertical to the main surface "b" of the second semiconductor chip 2. Second semiconductor chip electrodes 12, which are the same in number as the first semiconductor chip electrodes 8, are formed on the second connection portion 4 at a specified interval along a direction vertical to the drawings such that the second semiconductor chip electrodes 12 are insulated by an insulation member.

In the multi-chip semiconductor device 100, the second connection portion 4 is fitted into and connected to the first connection portion 3 such that the main surface "a" of the first semiconductor chip 1 and the main surface "b" of the second semiconductor chip 2 are vertical to each other. In this specification, the state in which the main surface "a" of the first semiconductor chip 1 and the main surface "b" of the second semiconductor chip 2 are vertical to each other indicates that an angle (θ) between the main surface "a" and the main surface "b" satisfies 80°<θ<110°. Preferably, the angle (θ) between the first semiconductor chip 1 and the second semiconductor chip 2 is 90°. The first connection portion 3 and the second connection portion 4 are connected to each other by a conductive member such as solder. Thus, the first semiconductor chip electrodes 8 and the second semiconductor chip electrodes 12 are electrically connected to each other.

Preferably, a periphery of a connection between the first connection portion 3 and the second connection portion 4 is reinforced by a reinforcement member 13. The reinforcement member 13 is made of a reinforced resin and the like. Since the periphery of the connection is reinforced by the reinforcement member 13, a mechanical strength of the multi-chip semiconductor device 100 can be improved.

In the multi-chip semiconductor device 100 according to the first embodiment, the first semiconductor chip 1 and the second semiconductor chip 2 are connected to each other through the first connection portion 3 and the second connection portion 4 which include the inclined surfaces. With this structure, an electrical connection area can be increased, resistance value of the connection portions can be lowered, and thus the effect on a transmission signal can be reduced. In the multi-chip semiconductor device 100, furthermore, since each of the first connection portion 3 and the second connection portion 4 has a tapered shape, it is possible to reduce stress concentration and thus prevent damage to the semiconductor chips when an external force is exerted on the connection portions. Moreover, since the first semiconductor chip 1 and the second semiconductor chip 2 are connected to each other such that the second connection portion 4 is fitted into the groove-shaped first connection portion 3, alignment can be easily achieved and also accuracy can be improved.

Second Embodiment

Figure 2:
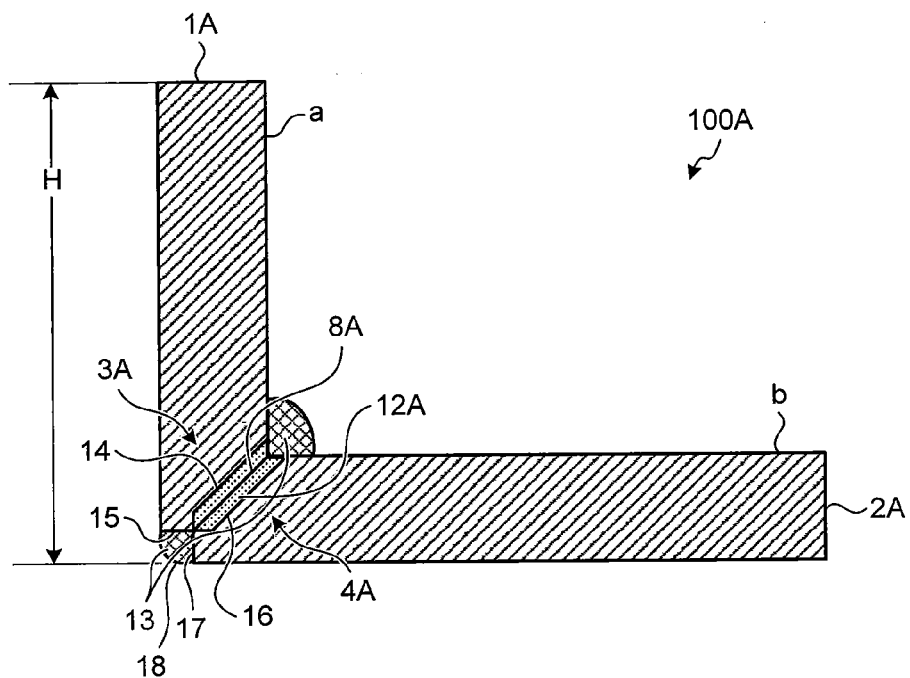
FIG. 2 is a cross-sectional view of a multi-chip semiconductor device according to a second embodiment of the invention.
Figure 3:
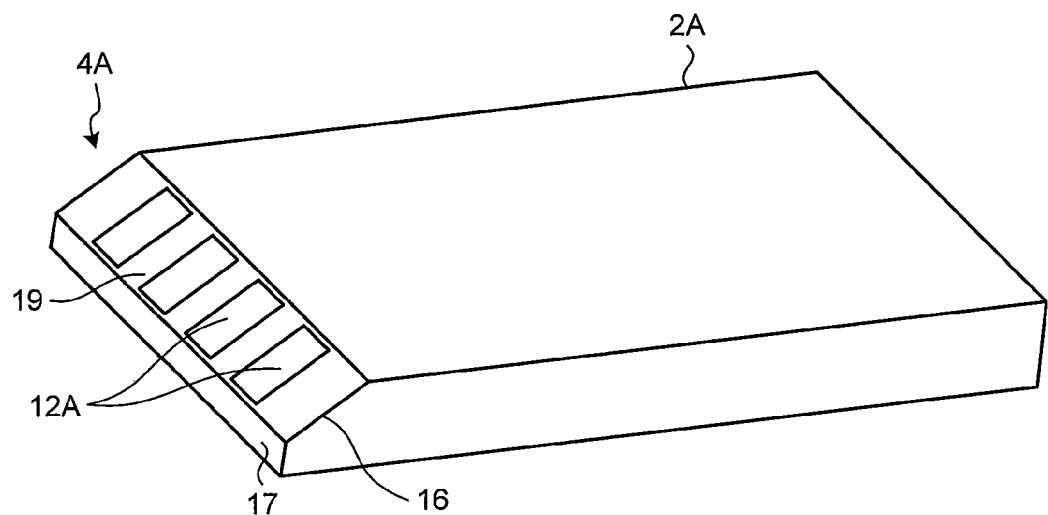
FIG. 3 is a perspective view of a second semiconductor chip illustrated in FIG. 2.

FIG. 2 is a cross-sectional view of a multi-chip semiconductor device 100A according to a second embodiment of the invention. FIG. 3 is a perspective view of a second semiconductor chip illustrated in FIG. 2. In the multi-chip semiconductor device 100A according to the second embodiment, a first semiconductor chip 1A and a second semiconductor chip 2A are connected to each other on side surfaces of the first semiconductor chip 1A and the second semiconductor chip 2A.

The first semiconductor chip 1A is plate-shaped and includes a first connection portion 3A in which first semiconductor chip electrodes 8A are formed on the side surface vertical to a main surface "a". The first connection portion 3A includes an inclined surface 14 which is inclined with respect to the main surface "a" of the first semiconductor chip 1A and a vertical surface 15 which is vertical to the main surface "a" of the first semiconductor chip 1A. The first semiconductor chip electrodes 8A, which are the same in number as second semiconductor chip electrodes to be described below, are formed on the inclined surface 14 at a specified interval such that the plurality of first semiconductor chip electrodes 8A are insulated by an insulation member.

The second semiconductor chip 2A is plate-shaped and includes a second connection portion 4A in which second semiconductor chip electrodes 12A are formed on the side surface which is vertical to a main surface "b", as illustrated in FIG. 3. The second connection portion 4A includes an inclined surface 16 which is inclined with respect to the main surface "b" of the second semiconductor chip 2A and a vertical surface 17 which is vertical to the main surface "b" of the second semiconductor chip 2A. In FIG. 3, as an example, four second semiconductor chip electrodes 12A are formed on the inclined surface 16 at a specified interval, but the invention is not limited thereto. The plurality of second semiconductor chip electrodes 12A are insulated by an insulation member 19.

In the multi-chip semiconductor device 100A according to the second embodiment, the inclined surface 14 inclined with respect to the main surface "a" of the first semiconductor chip 1A and the inclined surface 16 inclined with respect to the main surface "b" of the second semiconductor chip 2A are connected so as to face each other, and thus the main surface "a" of the first semiconductor chip 1A and the main surface "b" of the second semiconductor chip 2A are vertical to each other. The inclined surface 14 and the inclined surface 16 are connected by a conductive member such as solder, and thus the first semiconductor chip electrodes 8A and the second semiconductor chip electrodes 12A are electrically connected to each other.

The multi-chip semiconductor device 100A includes a reinforcement-member filling space 18 which is a space enclosed by the vertical surface 15 vertical to the main surface "a" of the first semiconductor chip 1A and the vertical surface 17 vertical to the main surface "b" of the second semiconductor chip 2A. The mechanical strength of the multi-chip semiconductor device 100A can be improved by the reinforcement member 13 filled in the reinforcement-member filling space 18 and by reinforcing the other side of a connection surface between the first semiconductor chip 1A and the second semiconductor chip 2A with the reinforcement member 13. Furthermore, as the reinforcement member 13, the reinforced resin can be used, for example, and the conductive member such as solder can also be used.

The mechanical strength of the multi-chip semiconductor device 100A can be improved by the reinforcement-member filling space 18 provided in the multi-chip semiconductor device 100A. Moreover, since the reinforcement-member filling space 18 is formed in the space enclosed by the vertical surface 15 and the vertical surface 17, it is possible to reduce a height H of the multi-chip semiconductor device 100A.

According to the multi-chip semiconductor device 100A of the second embodiment, since the semiconductor chips are connected to each other through a connection surface inclined with respect to the main surface of each semiconductor chip, the electrical connection area can be increased, the resistance value of the connection portions can be lowered, and thus the effect on the transmission signal can be reduced. In the multi-chip semiconductor device 100A, furthermore, the reinforcement member 13 is filled in the reinforcement-member filling space 18, and thus it is possible to improve the connection strength while suppressing an increase in size.

Figure 4:
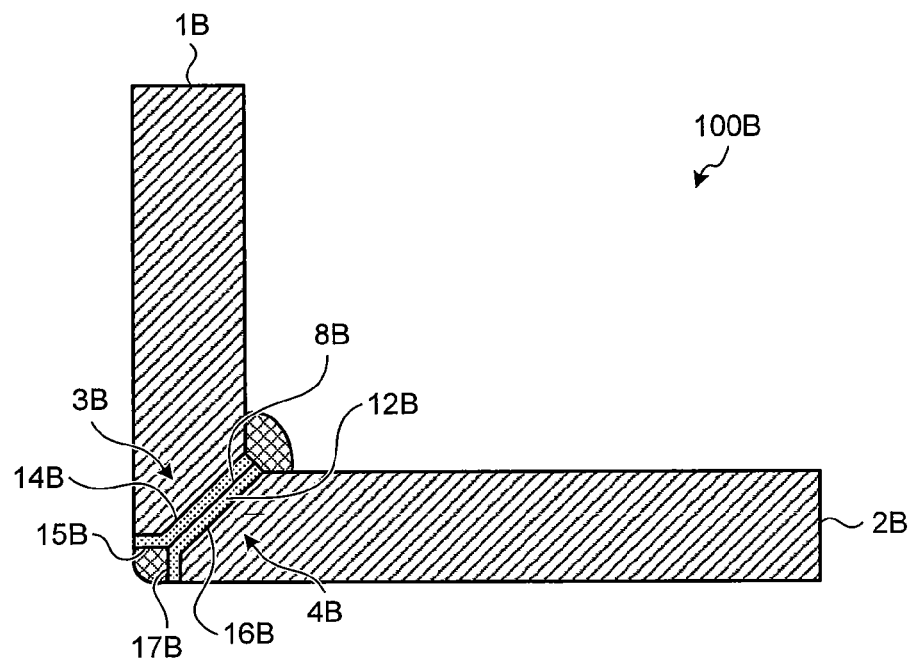
FIG. 4 is a cross-sectional view of a multi-chip semiconductor device according to a first modified example of the second embodiment.

As a first modified example of the second embodiment, an exemplary multi-chip semiconductor device is illustrated in FIG. 4. In a multi-chip semiconductor device 100B, as the reinforcement member 13 which is filled in the reinforcement-member filling space 18, the conductive member is used. First semiconductor chip electrodes 8B are formed on an inclined surface 14B and a vertical surface 15B, and second semiconductor chip electrodes 12B are formed on an inclined surface 16B and a vertical surface 17B. With this structure, the electrical connection area of the multi-chip semiconductor device 100B can be increased more than that of the multi-chip semiconductor device 100A according to the second embodiment. Thus, the resistance of the connection portions can be further reduced.

Figure 5:
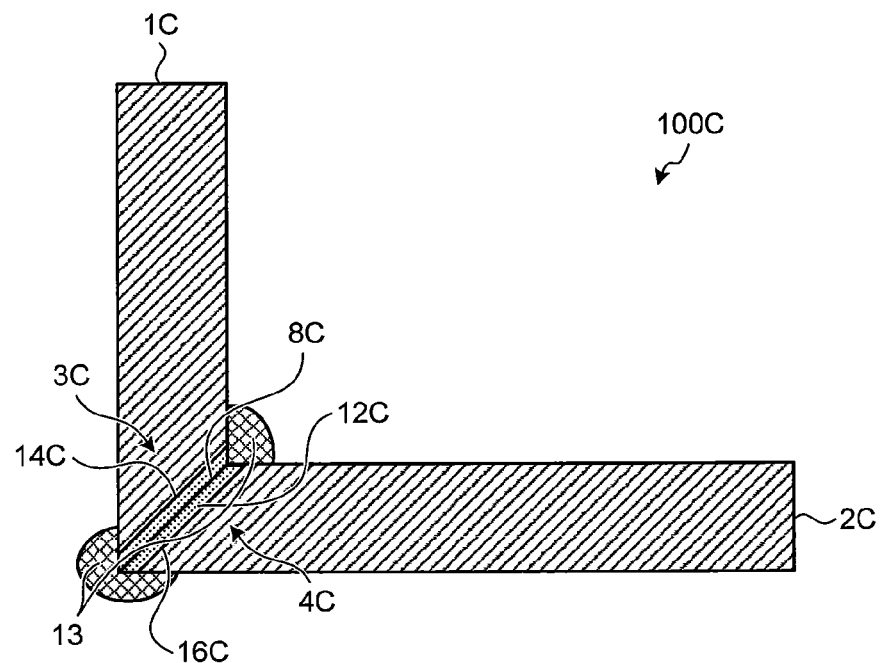
FIG. 5 is a cross-sectional view of a multi-chip semiconductor device according to a second modified example of the second embodiment.

If reduction in size is unnecessary, a multi-chip semiconductor device illustrated in FIG. 5 can be used. In a multi-chip semiconductor device 100C illustrated in FIG. 5, a first connection portion 3C including only an inclined surface 14C and a second connection portion 4C including only an inclined surface 16C are connected to each other. According to the multi-chip semiconductor device 100C, the semiconductor chips are connected to each other such that the inclined surface 14C and the inclined surface 16C, which are inclined with respect to the main surfaces of the respective semiconductor chip, face each other, as with the multi-chip semiconductor device 100A according to the second embodiment. With this structure, the electrical connection area of the multi-chip semiconductor device 100C can be increased, the resistance value of the connection portions can be lowered, and thus the effect on the transmission signal can be reduced.

Third Embodiment

Figure 6:
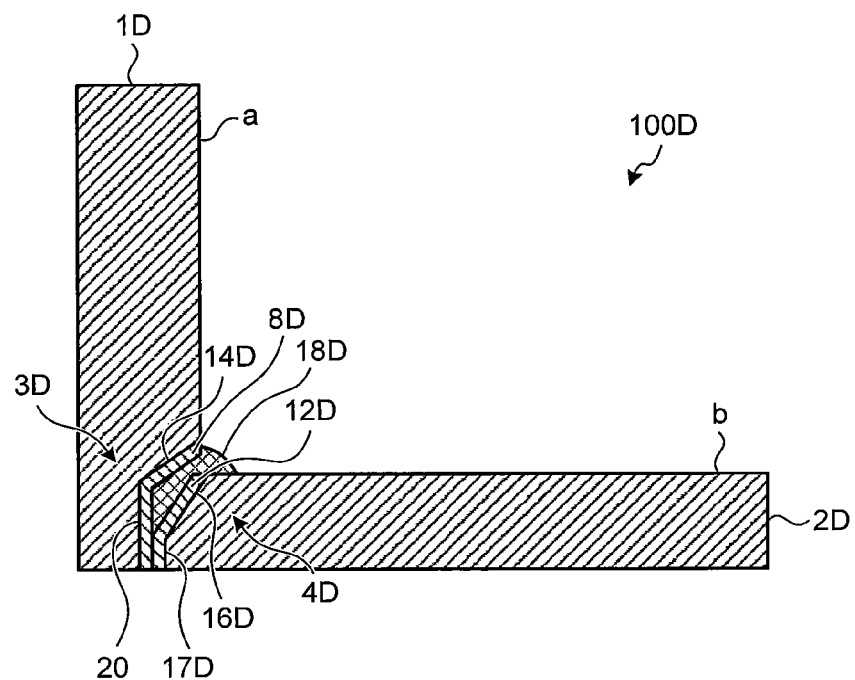
FIG. 6 is a cross-sectional view of a multi-chip semiconductor device according to a third embodiment of the invention.

FIG. 6 is a cross-sectional view of a multi-chip semiconductor device 100D according to a third embodiment of the invention. In the multi-chip semiconductor device 100D according to the third embodiment, a first semiconductor chip 1D and a second semiconductor chip 2D are connected to each other on side surfaces of the first semiconductor chip 1D and the second semiconductor chip 2D.

The first semiconductor chip 1D is plate-shaped and includes a first connection portion 3D in which first semiconductor chip electrodes 8D are formed on the side surface which is vertical to a main surface "a". The first connection portion 3D includes an inclined surface 14D inclined with respect to the main surface "a" of the first semiconductor chip 1D and a parallel surface 20 parallel to the main surface "a" of the first semiconductor chip 1D. The first semiconductor chip electrodes 8D are formed on the inclined surface 14D and the parallel surface 20 at a specified interval such that each of the first semiconductor chip electrodes 8D is insulated by the insulation member.

The second semiconductor chip 2D is plate-shaped and includes a second connection portion 4D in which second semiconductor chip electrodes 12D are formed on the side surface which is vertical to a main surface "b". The second connection portion 4D includes an inclined surface 16D inclined with respect to the main surface "b" of the second semiconductor chip 2D and a vertical surface 17D vertical to the main surface "b" of the second semiconductor chip 2D. The second semiconductor chip electrodes 12D, which are the same in number as the first semiconductor chip electrodes 8D, are formed on the inclined surface 16D and the vertical surface 17D at a specified interval such that the second semiconductor chip electrodes 12D are insulated by an insulation member.

The first connection portion 3D can be formed by etching. For example, if the first connection portion 3D including the parallel surface 20 and the inclined surface 14D is formed by the etching in the first semiconductor chip 1D made of silicon, the inclined surface 14D having a specified inclined angle can be formed because etching rates vary depending on directions of crystal plane.

In the multi-chip semiconductor device 100D according to the third embodiment, the parallel surface 20 parallel to the main surface "a" of the first semiconductor chip 1D and the vertical surface 17D vertical to the main surface "b" of the second semiconductor chip 2D are connected so as to face each other, and thus the main surface "a" of the first semiconductor chip 1D and the main surface "b" of the second semiconductor chip 2D are vertical to each other. The parallel surface 20 and the vertical surface 17D are connected by the conductive member such as solder.

The multi-chip semiconductor device 100D includes a reinforcement-member filling space 18D which is a space mainly enclosed by the inclined surface 14D inclined with respect to the main surface "a" of the first semiconductor chip 1D and the inclined surface 16D inclined with respect to the main surface "b" of the second semiconductor chip 2D. By filling the conductive member as the reinforcement member 13 in the reinforcement-member filling space 18D, the mechanical strength of the multi-chip semiconductor device 100D can be improved, the connection area between the first semiconductor chip electrodes 8D and the second semiconductor chip electrodes 12D can be increased, the resistance value of the connection portions can be lowered, and thus the effect on the transmission signal can be reduced.

According to the multi-chip semiconductor device 100D of the third embodiment, the semiconductor chips are connected such that the parallel surface 20 and the vertical surface 17D face each other, and the conductive member is filled in the reinforcement-member filling space 18D. With this structure, the mechanical strength of the multi-chip semiconductor device 100D can be improved, and the resistance of the connection portions can be lowered.

Figure 7:
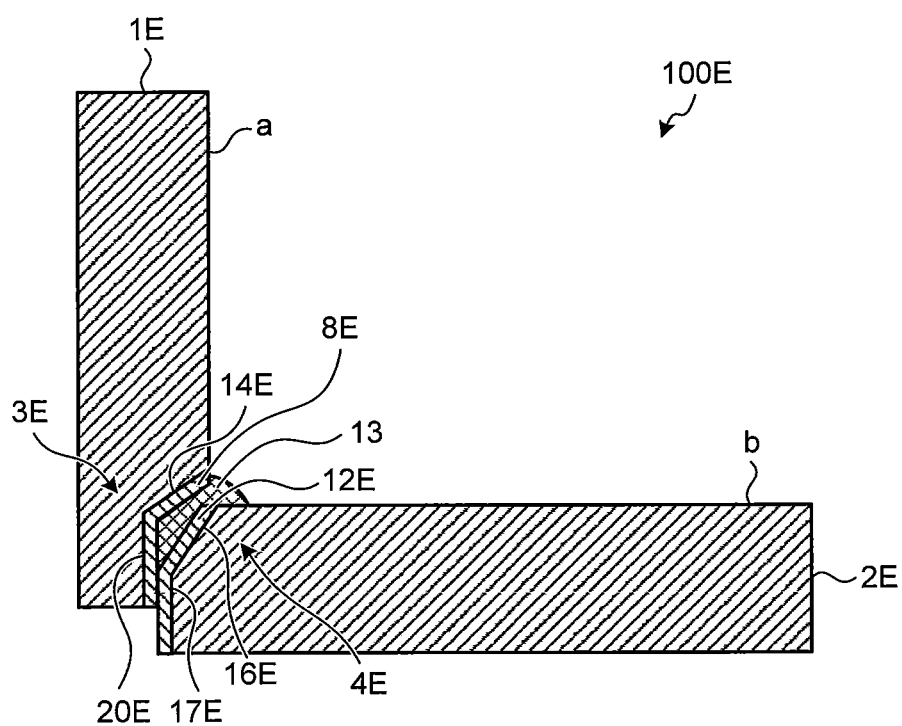
FIG. 7 is a cross-sectional view of a multi-chip semiconductor device according to a modified example of the third embodiment.

As a modified example of the third embodiment, an exemplary multi-chip semiconductor device 100E is illustrated in FIG. 7. In the multi-chip semiconductor device 100E, by adjusting a length ratio between an inclined surface 14E and a parallel surface 20E and a length ratio between an inclined surface 16E and a vertical surface 17E, a space which is not connected to the parallel surface 20E is formed on the vertical surface 17E. The reinforcement member 13 can be filled in the above-described space, thereby improving the mechanical strength of the multi-chip semiconductor device 100E and also mounting other chips.

In some embodiments, the above-described multi-chip semiconductor devices are useful in an imaging module such as a digital camera, a digital video camera, a mobile phone having an imaging function, or an endoscope system for observing internal organs of a subject.

According to some embodiments, it is possible to easily achieve position adjustment with high accuracy and to reduce deterioration of transmission signal through the connection portions having the connection surfaces inclined with respect to the main surfaces of the semiconductor chips.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

REFERENCE SIGNS LIST 1, 1A, 1B, 1C, 1D, 1E first semiconductor chip
2, 2A, 2B, 2C, 2D, 2E second semiconductor chip 3, 3A, 3B, 3C, 3D, 3E first connection portion
4, 4A, 4B, 4C, 4D, 4E second connection portion
5 first inclined surface
6 second inclined surface
7, 11 bottom surface
8, 8A, 8B, 8C, 8D, 8E first semiconductor chip electrode
9 third inclined surface
10 fourth inclined surface
12, 12A, 12B, 12C, 12D, 12E second semiconductor chip electrode
13 reinforcement member
14, 14B, 14C, 14D, 14E, 16, 16B, 16C, 16D, 16E inclined surface
15, 15B, 17, 17B, 17D, 17E vertical surface
18, 18D reinforcement-member filling space
19 insulation member
20, 20E parallel surface
100, 100A, 100B, 100C, 100D, 100E multi-chip semiconductor device

What is claimed is:

1. A multi-chip semiconductor device, comprising:
a first semiconductor chip that is plate-shaped, the first semiconductor chip including a first connection portion formed on a first side surface of the first semiconductor chip; and
a second semiconductor chip that is plate-shaped, the second semiconductor chip including a second connection portion formed on a second side surface of the second semiconductor chip,
wherein
the first connection portion including a first inclined surface that is inclined with respect to a first main surface of the first semiconductor chip and a second inclined surface that is inclined with respect to the first inclined surface such that the first inclined surface intersects with the second inclined surface,
the second connection portion including a third inclined surface that is inclined with respect to a second main surface of the second semiconductor chip and a fourth inclined surface that is inclined with respect to the third inclined surface such that the third inclined surface intersects with the fourth inclined surface,
a first electrode is formed on at least the first inclined surface of the first connection portion and a second electrode is formed on at least the third inclined surface of the second connection portion;
the first electrode formed on at least the first inclined surface of the first connection portion and the second electrode formed on at least the third inclined surface of the second connection portion are connected so as to face each other such that the first main surface of the first semiconductor chip and the second main surface of the second semiconductor chip are offset non-parallel relative to each other; and
a reinforcement member is disposed in a reinforcement-member filling space at least partially defined by the second inclined surface of the first connection portion and the fourth inclined surface of the second connection portion.

2. The multi-chip semiconductor device according to claim 1, wherein:
the first electrode is formed on each of the first inclined surface and the second inclined surface of the first connection portion;
the second electrode is formed on each of the third inclined surface and the fourth inclined surface of the second connection portion; and
the reinforcement member is conductive so as to electrically connect the first electrode to the second electrode.

3. The multi-chip semiconductor device according to claim 1, wherein the first main surface of the first semiconductor chip and the second main surface of the second semiconductor chip are offset 90 degrees relative to each other.

4. The multi-chip semiconductor device according to claim 1, wherein:
the first inclined surface is inclined at 45 degrees relative to the first main surface; and
the third inclined surface is inclined at 45 degrees relative to the second main surface.

5. The multi-chip semiconductor device according to claim 4, wherein:
the second inclined surface is inclined at 90 degrees relative to the first main surface; and
the fourth inclined surface is inclined at 90 degrees relative to the second main surface.

* * * * *